(12) United States Patent
Moon et al.

(10) Patent No.: US 8,900,508 B2
(45) Date of Patent: Dec. 2, 2014

(54) METHOD AND APPARATUS FOR FABRICATING HIGH PURITY SILICON COMPACTS USING SILICON POWDERS, AND BINDER-FREE SILICON COMPACT FABRICATED BY THE SAME

(75) Inventors: Byoung Moon Moon, Seoul (KR); Je Sik Shin, Goyang-si (KR); Kyu Suk Choi, Gwacheon-si (KR)

(73) Assignees: Korea Institute of Industrial Technology, Cheonan-Si (KR); KCC Corporation, Seoul (KR)

( * ) Notice: Subject to any disclaimer, the term of this patent is extended or adjusted under 35 U.S.C. 154(b) by 1076 days.

(21) Appl. No.: 12/358,642

(22) Filed: Jan. 23, 2009

(65) Prior Publication Data

US 2009/0191112 A1 Jul. 30, 2009

(30) Foreign Application Priority Data

Jan. 25, 2008 (KR) .................. 10-2008-0008289

(51) Int. Cl.
*H05B 6/00* (2006.01)
*H01L 31/18* (2006.01)
*C01B 33/02* (2006.01)

(52) U.S. Cl.
CPC .............. *H01L 31/182* (2013.01); *C01B 33/02* (2013.01); *Y02E 10/546* (2013.01)
USPC ............ 264/434; 264/403; 264/486; 264/663

(58) Field of Classification Search
CPC .............................. C01B 33/02; H01L 31/182
USPC ......... 264/434, 109, 1.1, 1.21, 1.36, 2.2, 402, 264/403, 404, 486, 603, 101, 102, 239, 299, 264/663
See application file for complete search history.

(56) References Cited

U.S. PATENT DOCUMENTS

| | | | | |
|---|---|---|---|---|
| 3,002,320 A | * | 10/1961 | Theuerer | 264/300 |
| 3,868,435 A | * | 2/1975 | Daxer et al. | 264/1.21 |
| 4,040,849 A | * | 8/1977 | Greskovich et al. | 423/348 |
| 4,560,668 A | * | 12/1985 | Hunold et al. | 501/92 |
| 4,952,293 A | * | 8/1990 | Sypula et al. | 204/479 |
| 5,597,523 A | | 1/1997 | Sakai et al. | |
| 5,817,285 A | * | 10/1998 | Fukuoka et al. | 423/344 |
| 2008/0220558 A1 | * | 9/2008 | Zehavi et al. | 438/57 |
| 2009/0020067 A1 | * | 1/2009 | Su et al. | 117/3 |

FOREIGN PATENT DOCUMENTS

KR  10-1995-0024858    9/1995

* cited by examiner

*Primary Examiner* — Amjad Abraham
*Assistant Examiner* — Ninh Le
(74) *Attorney, Agent, or Firm* — Lexyoume IP Meister, PLLC.

(57) ABSTRACT

Disclosed are a method and an apparatus for fabricating solar-grade high purity polycrystalline silicon compacts. Silicon compacts are fabricating by loading polycrystalline silicon powders into a mold without addition of binders in a vacuum atmosphere, and pressurizing and heating the polycrystalline silicon powders. Heating method includes a high-frequency induction heating type, an Ohmic heating type, and a high current supply type.

15 Claims, 8 Drawing Sheets

METHOD AND APPARATUS FOR FABRICATING HIGH PURITY SILICON COMPACTS USING SILICON POWDERS, AND BINDER-FREE SILICON COMPACT FABRICATED BY THE SAME

BACKGROUND OF THE INVENTION

1. Field of the Invention

The present invention relates to a method and an apparatus for fabricating solar-grade high purity powder compacts using fine polycrystalline silicon powders without addition of binders, as well as a binder-free silicon compact fabricated by the same.

2. Description of the Related Art

The global solar cell market has been growing strongly by annual average growth of over 35% since the mid-1990s wherein crystalline silicon-based solar cells account for more than 97% of solar cells in the market in respect of material and take the initiative in market growth. In the meantime, high purity silicon material which is a core material for solar cells has been supplied by scraps of single crystalline silicon for semiconductor wafers or off-specification polycrystalline silicon. However, the global solar cell market has been rapidly growing since the mid-1990s and the supply did not fall short of the fast growing demand with the entrance toward the industrialized phase and consequently the solar cell market has reached the situation of serious supply shortage since 2004. Shortage phenomenon of silicon material will be continued worldwide for some time due to the demand for investment in facilities on a large scale in order to manufacture the polycrystalline silicon raw material. In particular for example, Korea depends on imports for almost all of demand and Korea is now trying to prepare for its own solution such as the construction of a silicon factory with 3,000 ton annual production capacity by DC Chemical Co., Ltd from 2006, to promote national solar cell industry and obtain the international competitiveness.

In the present day, worldwide high purity polycrystalline silicon is manufactured by purifying a raw material silane gas including silicon (trichlorosilane or mono-silane) and then precipitating a purified silane gas into a high purity dense polycrystalline silicon in a high temperature. At this time, a large amount of fine polycrystalline powders are produced as byproducts in the process of silane decomposition. Accordingly, the necessity for utilizing the fine polycrystalline silicon powders as the material for solar cells is being raised.

Upon examining closely attempts to use such polycrystalline silicon powders as the material for solar cells, you will find out that the Siemens and the Freiburg in Germany made researches to fabricate wafers directly from polycrystalline silicon powders using a sintering method in the past 1980s in order to reduce a manufacturing process and material loss. However, since this method was considered as not having merits, compared to the commercial processes, it did not reach commercialization. Until now the polycrystalline silicon powder, mixed with high purity raw materials, has been used mainly as a charge material of HEM process. Recently, methods of manufacturing a pellet-type compact from polycrystalline silicon powder to overcome problems involved in low capacity and handling have been proposed. To classify them largely, there are methods of manufacturing compacts with addition of chemical additives such as binders, or manufacturing compacts under a room temperature or through a melting process without using chemical additives such as binders. However, in view of research experience and viewpoint of inventors of this invention, there is a problem of containment due to remaining of chemical additives in the case of using chemical additives, there is a problem of the limitation of density and strength of compacts in the case of manufacturing under a room temperature without binders and there is a problem of being the possibility of pollution due to the passage of the melting process in the case of manufacturing through the melting process without binders.

Furthermore, there occurs only in Korea more than 100 ton per year of saw dust sludge during the manufacturing processes of semiconductors and solar cells but the sludge is now used as low level products (1~5$/kg).

Therefore, technology development of recycling scraps and saw dust sludge into low priced silicon raw material for solar cells is urgently needed in reality.

In "Technology of Compacting and Melting and Casting polycrystalline silicon fine powders for economical Si ingot production", B. M. Moon et al., published on Proceedings of The Korean Society for New and Renewable Energy on Jun. 21, 2007, a lot of fine powders produced in the process of manufacturing high purity polycrystalline silicon are washed and dried, 1.6 g to 1.8 g of the fine powders were loaded in a die without the addition of binders, the system including the die filled with fine powders was first evacuated to 3 torr and the fine powders are then compacted with a uniaxial pressure of 700 $kgf/cm^2$ in the room temperature. As a result, it is presented that polycrystalline silicon powder compacts can be obtained even without using binders.

In the case of a compact specimen using the washed powders without addition of binders, the electrical resistivity of the compact specimen does not reach electrical resistivity 0.5 $\Omega$cm which is generally required for wafers of solar cells. This is why byproducts produced in a wet washing process and contaminants contained in wash liquid itself are not removed completely.

At the time of silicon crystal growth, in order to prevent containments such as water and oxides from mixing due to a large surface area of polycrystalline silicon powders, the polycrystalline silicon powders were dried in a vacuum atmosphere or were subjected to a dry heat-treatment in a reducing atmosphere of 10% $H_2$—Ar in the temperature of 1,200~1,300° C., for one hour. The powders were then melted and fabricated to be silicon crystals. For two silicon crystalline powder compacts made in the above method, the electrical resistivity thereof was 3 $\Omega$cm and 4.6 $\Omega$cm, respectively.

However, the process for compacting stably and effectively fine powders generated a lot as by-products in the current process to precipitate high purity dense polycrystalline and powder scraps generated in the semiconductor process, was not proposed in this research.

In addition, since powders or scraps were low in a bulk density at the time of loading, melting efficiency was low and it was hardly possible to manufacture a large mass of ingot, it is difficult to handle and deliver powders or scraps and there was a problem that the contaminants are produced at the time of delivery.

SUMMARY OF THE INVENTION

It is an object of the present invention to provide a silicon compact which can facilitate handling and delivery, increase charging capacity, and assure solar-grade quality in using a charge material at the time of melting and casting an ingot for a solar cell, by fabricating a large amount of fine powders generated during a process of fabricating current high purity polycrystalline silicon and silicon scraps generated during a semiconductor process into high-density, high-strength compacts, and a method for fabricating the same.

Also, it is another object of the present invention to provide a silicon compact of high purity solar-grade quality, which does not have contaminants, using a large amount of fine powders generated during a process of fabricating current high purity polycrystalline silicon and silicon scraps generated during a semiconductor process, and a method for fabricating the same.

It is still another objection of the present invention to provide an apparatus that fabricates a raw material of solar-grade quality using fine powders generated during a process of fabricating polycrystalline silicon and silicon scraps generated during a semiconductor process.

With the present invention, a method of fabricating high purity silicon compacts comprises loading fine polycrystalline silicon powders into a mold in a vacuum atmosphere, and pressurizing and heating the polycrystalline silicon powders.

Preferably, the method further comprises a pre-treating step of drying the fine polycrystalline silicon powders in a vacuum atmosphere. The vacuum drying is performed at 90 to 100° C. for 10 to 24 hours within a vacuum oven.

Preferably, the vacuum dried polycrystalline silicon powders are vacuum-wrapped in a state where they are out of contact with a container.

The fine polycrystalline silicon powders are fine polycrystalline silicon powders generated in a process of fabricating current high purity polycrystalline silicon, that is, thermal decomposition process of silicon containing gases such as $SiHCl_3$ and $SiH_4$, so-called "Siemens process" and are the fine polycrystalline powders as well as silicon scraps generated in the semiconductor process, and more specifically, may use even silicon scraps generated in a process of fabricating a silicon substrate by slicing a mono/polysilicon ingot.

The pressurizing and heating comprises heating the fine polycrystalline silicon powders or the silicon scraps in a die type mold to be sintered by a high frequency induction heating while applying pressure thereto, heating the fine polycrystalline silicon powders or the silicon scraps in the mold to be sintered by an Ohmic heating body while applying pressure thereto, or heating the fine polycrystalline silicon powders or the silicon scraps in the mold to be sintered by applying large current to the silicon powders or the silicon scraps while applying pressure thereto.

Preferably, the pressurizing and heating is performed at a molding pressure and a molding temperature that can generate a reaction of reducing oxide existing on a surface of the polycrystalline silicon powders. Preferably, the molding pressure is at least 20 MPa and the molding temperature is at least 900° C., more preferably, the molding pressure is at least 80 MPa and the molding temperature is at least 800° C.

Preferably, the pressurizing and heating is holded at the molding pressure and the molding temperature for at least 60 seconds, preferably at least 180 seconds.

In addition, it is preferable to remove a contamination layer at a surface part of the silicon compacts, for example by performing an air washing after the pressurizing and heating.

According to the present invention, the polycrystalline silicon powders or the silicon scraps, which are subjected to only the drying without using the binder and without being subject to the washing, are molded by the three molding types to fabricate the compacts. All of the fabricated silicon compacts exhibit the electrical resistivity (4 to 25 Ωcm) higher than the electrical resistivity 0.5 Ωcm that is generally required for the wafer for the solar cell.

Further, the silicon compacts according to the present invention exhibit excellent strength (bending strength up to 48 MPa).

Moreover, the silicon compacts according to the present invention exhibit excellent density (62 to 73% of theoretical density of bulk silicon).

Therefore, these silicon compacts are suitable as the raw material of the solar-grade quality.

DETAILED DESCRIPTION OF THE INVENTION

Practical and presently preferred embodiments of the present invention are illustrative as shown in the following Examples and Comparative Examples.

However, it will be appreciated that those skilled in the art, on consideration of this disclosure, may make modifications and improvements within the spirit and scope of the present invention.

Figure 1:
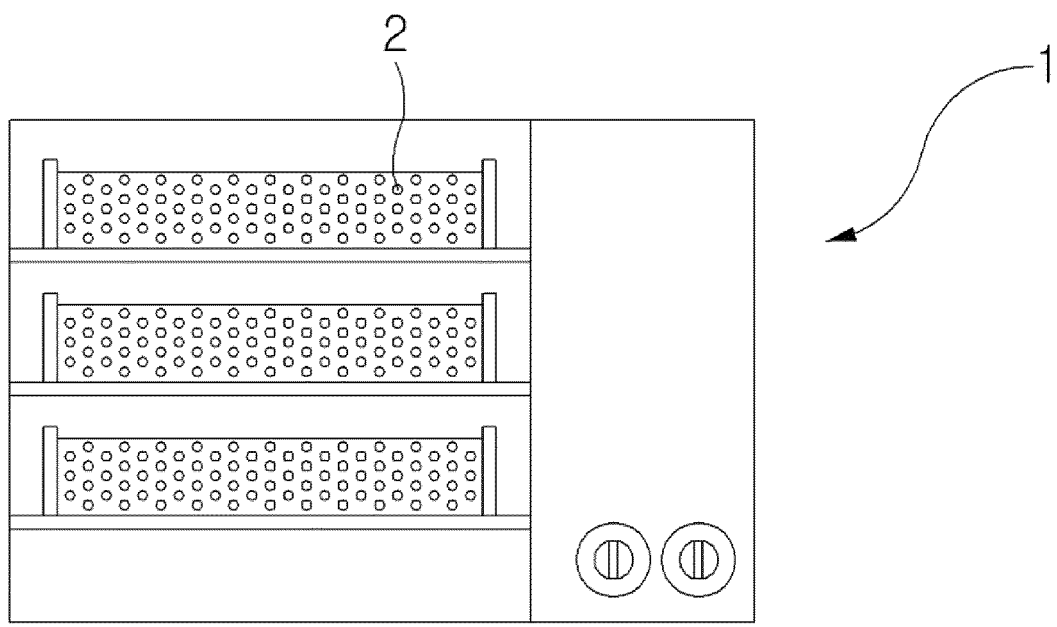
FIG. 1 is a diagram showing a vacuum drying oven that dries silicon powders according to the present invention.

(1) Fine polycrystalline silicon powders generated in a process of fabricating a high purity polycrystalline silicon bar or silicon scraps 2 generated in a semiconductor process are dried in a vacuum atmosphere, preferably a vacuum oven 1 so as to suppress a mixing problem of impurities (see FIG. 1). The temperature is holded at 90 to 100° C. for 10 to 24 hours. Also, when there is a need to fabricate a higher purity polycrystalline silicon crystal, it is heat-treated in a reduction atmosphere, preferably within hydrogen mixing gas atmosphere where $P_{H_2O}/P_{H_2}$ fraction within the atmosphere using a moisture getter is reduced to $10^{-5}$ or less. The temperature is holded at 1000 to 1400° C. for several tens minutes to several hours. Hereinafter, the fine polycrystalline silicon powders or the silicon scraps generated in the semiconductor process are referred to as "silicon powders".

If the silicon powders are molded using a binder, etc., they are contaminated. As a result, it is very difficult to make the silicon powders into the compacts without using a binder. The reason is that if the powders absorb moisture, they are contaminated with oxygen and hydrogen. Therefore, the fine polycrystalline silicon powders 2 generated in the process of fabricating the high purity polycrystalline silicon bar are first subjected to a pre-treatment within the vacuum oven at a temperature of 90° or more. The moisture is removed by performing the pre-treatment.

2) Vacuum wrapping is performed so that the dry processed powders are out of contact with a container.

3) The dried silicon powders are loaded in the mold in the vacuum atmosphere and are molded while pressurizing and heating in the vacuum atmosphere.

Firstly, a high frequency induction coil is used.

A configuration of a silicon powder molding apparatus using the induction coil according to the present invention will be described with respect to FIGS. 2 and 2a. The silicon powder molding apparatus includes:

1) a die assembly (die, upper and lower punches) configured of a die 21 in which powders are loaded and upper and lower punches 23a and 23b that pressure the silicon powders 22 loaded in the die 21;

2) an induction coil 24 that surrounds a circumference of the die 21 and applies heat to the silicon powders 22 in the die;

3) an oil pressure means that actuates the upper and lower punches 23a and 23b applying pressure to the silicon powders 22;

4) a vacuum means that maintains the chamber 25 including the silicon powders 22 loaded in the die, the die assembly, and the induction coil 24 in a vacuum state; and 5) a controlling means 26 that controls these means.

Figure 2:
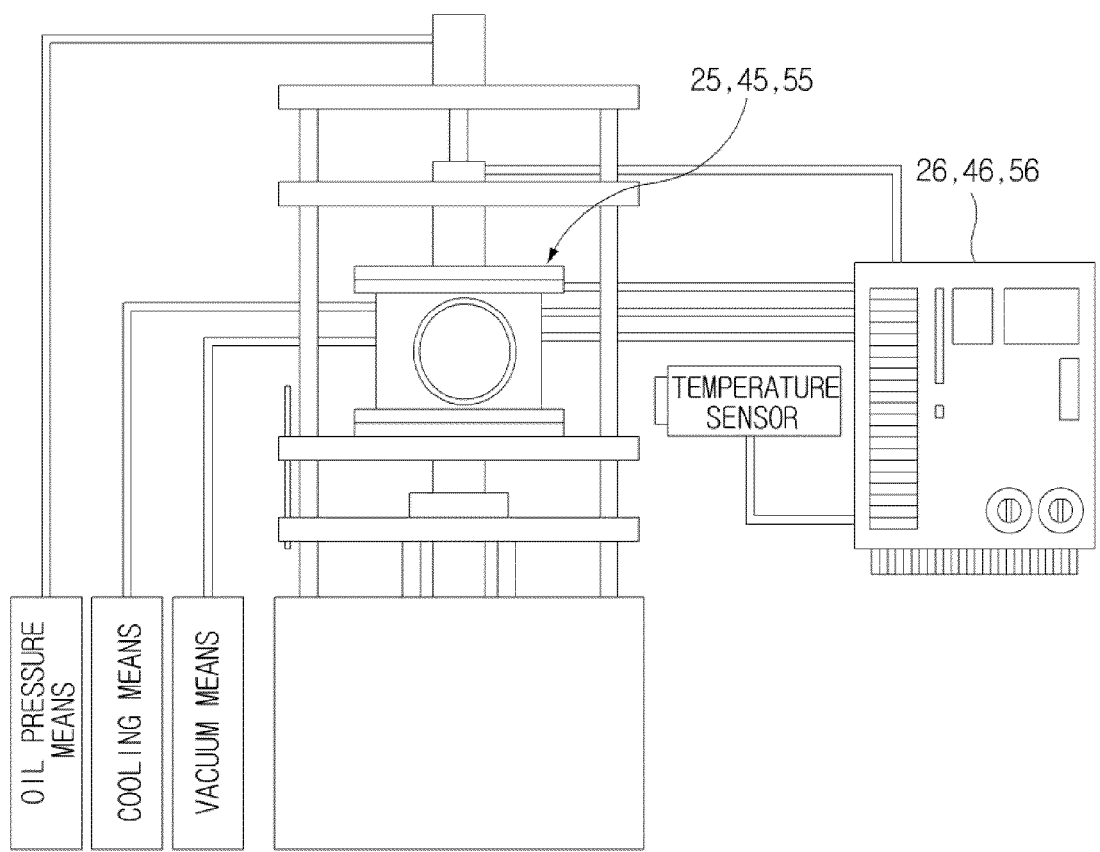
FIG. 2 is a schematic diagram showing a configuration of an apparatus of fabricating silicon compacts according to the present invention.
Figure 2A:
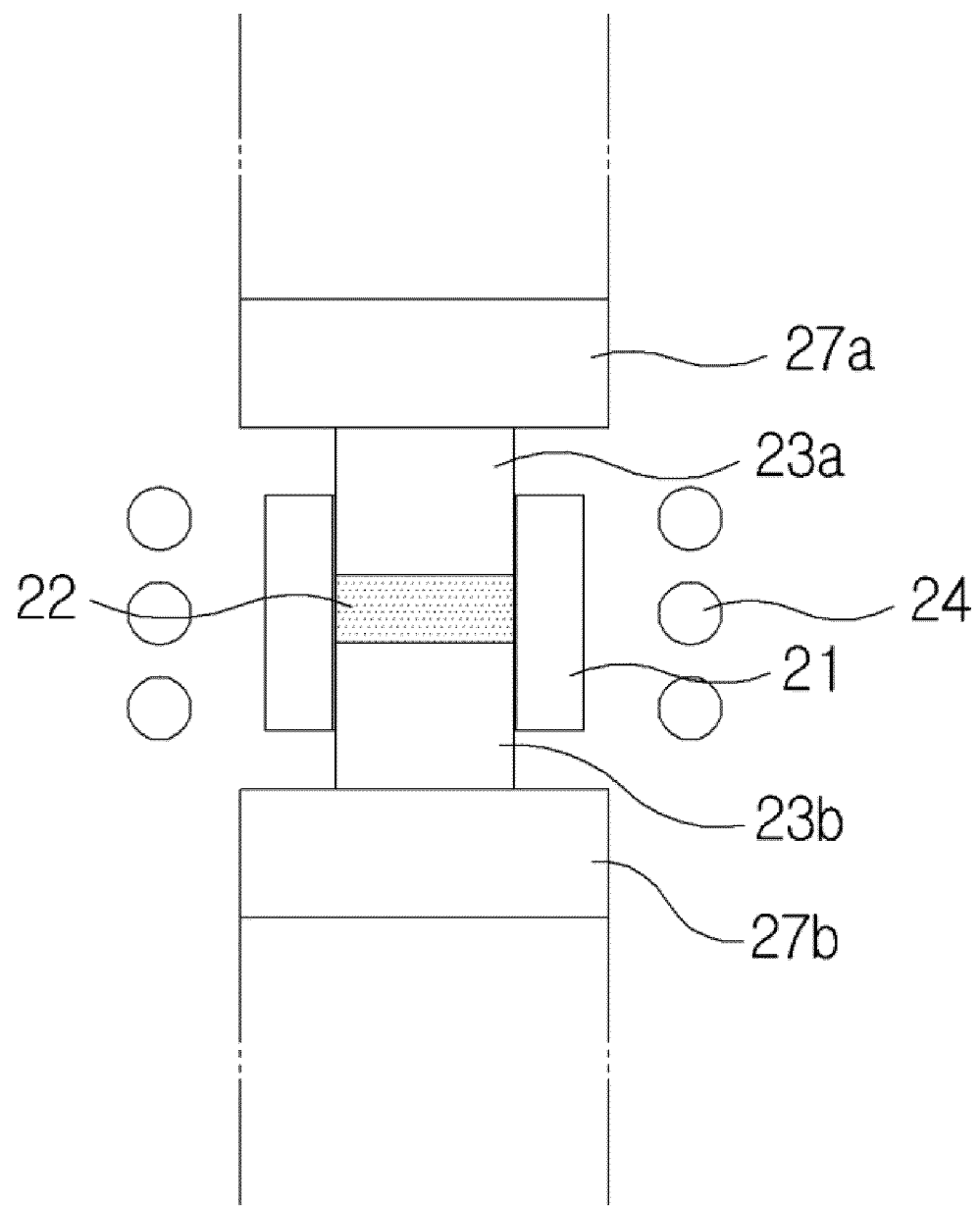
FIG. 2A is a cross-sectional view showing in detail a structure of an inside of a chamber for describing the pressurizing and the high frequency induction heating according to the present invention.

As shown in FIGS. 2 and 2a, a vacuum means such as a vacuum pump, etc., for making the vacuum chamber 25 into vacuum is provided. The die type mold 21 for loading the silicon powders 22 in the vacuum chamber 25 is arranged and the upper and lower punches 23a and 23b on refractory blocks 27a and 27b, which are actuated up and down by oil pressure for pressurizing the silicon powders 22 loaded in the mold 21, are inserted into the mold 21. Preferably, as the mold 21a graphite die is used, as the refractory blocks 27a and 27b an alumina block is used, as the upper and lower punches 23a and 23b a graphite punch is used. Graphite is a very useful material in terms of an induction heating and a reduction of manufacturing costs.

The high frequency induction coil 24 is arranged around the mold 21 for heating the silicon powders in the mold. With the induced current flowing in the graphite die positioned at the induction coil in which high frequency current flows, heat is generated and the generated heat is transferred to the silicon powders, thereby triggering the sintering reaction.

Alternating (high frequency) current flows in the coil to generate alternating magnetic field around the coil and induced current is generated in an electrical conductor disposed in the magnetic field. This current is referred to as the induced current and Joule heat is generated by the inherent resistance and induced current of a heated body. This is referred to as an eddy current loss, which is a heating source in the induced heating.

Also, a cooling means, which cools the silicon powder compacts after the pressurizing and heating, is provided.

A predetermined amount of silicon powders loaded in the mold are pressurized and subjected to the high frequency induction heating, thereby obtaining the silicon powder compacts. At this time, the high frequency induction heating type is used.

Figure 3:
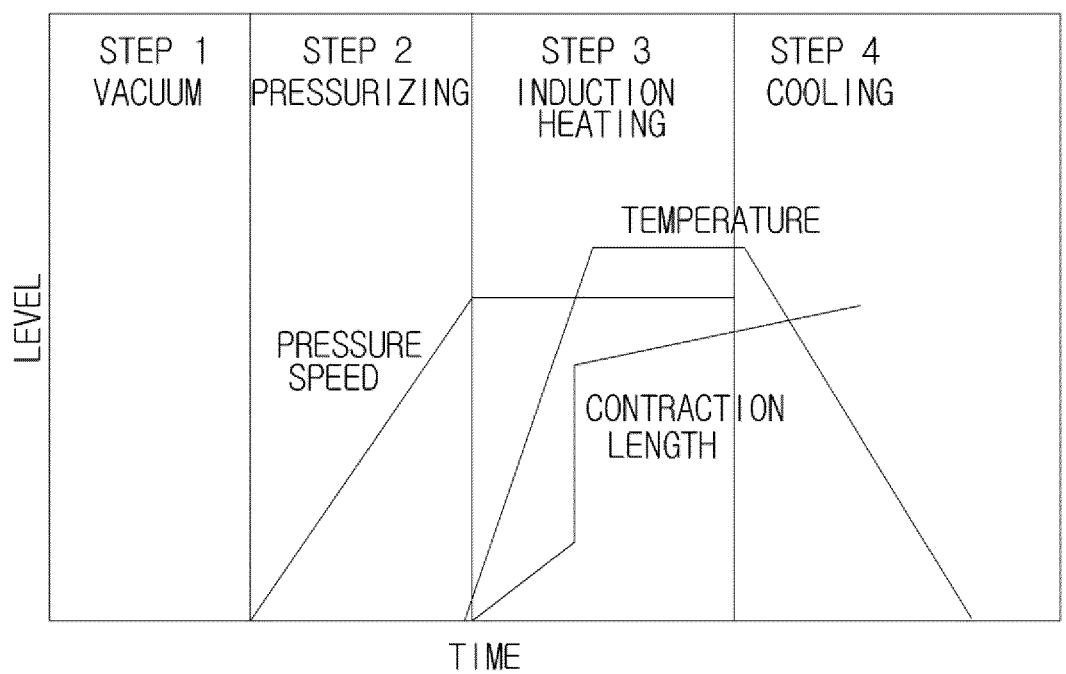
FIG. 3 is a profile showing operation order, pressure, temperature, and contraction length over time in sintering by the high frequency induction heating according to the present invention.

The process that loads the silicon powders in the mold in a vacuum atmosphere and molds the silicon powders while pressurizing and heating them in a vacuum atmosphere will be described with respect to FIG. 3.

The dried silicon powders are loaded in the mold. Thereafter, the inside of the chamber is maintained in a vacuum state by using the vacuum means and then, reaches a predetermined pressure by applying pressure while increasing a pressure speed. If the inside of the chamber reaches a predetermined pressure, current is applied to the induction coil while constantly maintaining the pressure. If the inside of the chamber reaches a predetermined temperature, the silicon powders are heated while constantly maintaining the temperature. After a desired heating time elapses, the silicon powders are cooled and the silicon compacts are taken out of the chamber.

Secondly, an Ohmic heating body is used.

Figure 4:
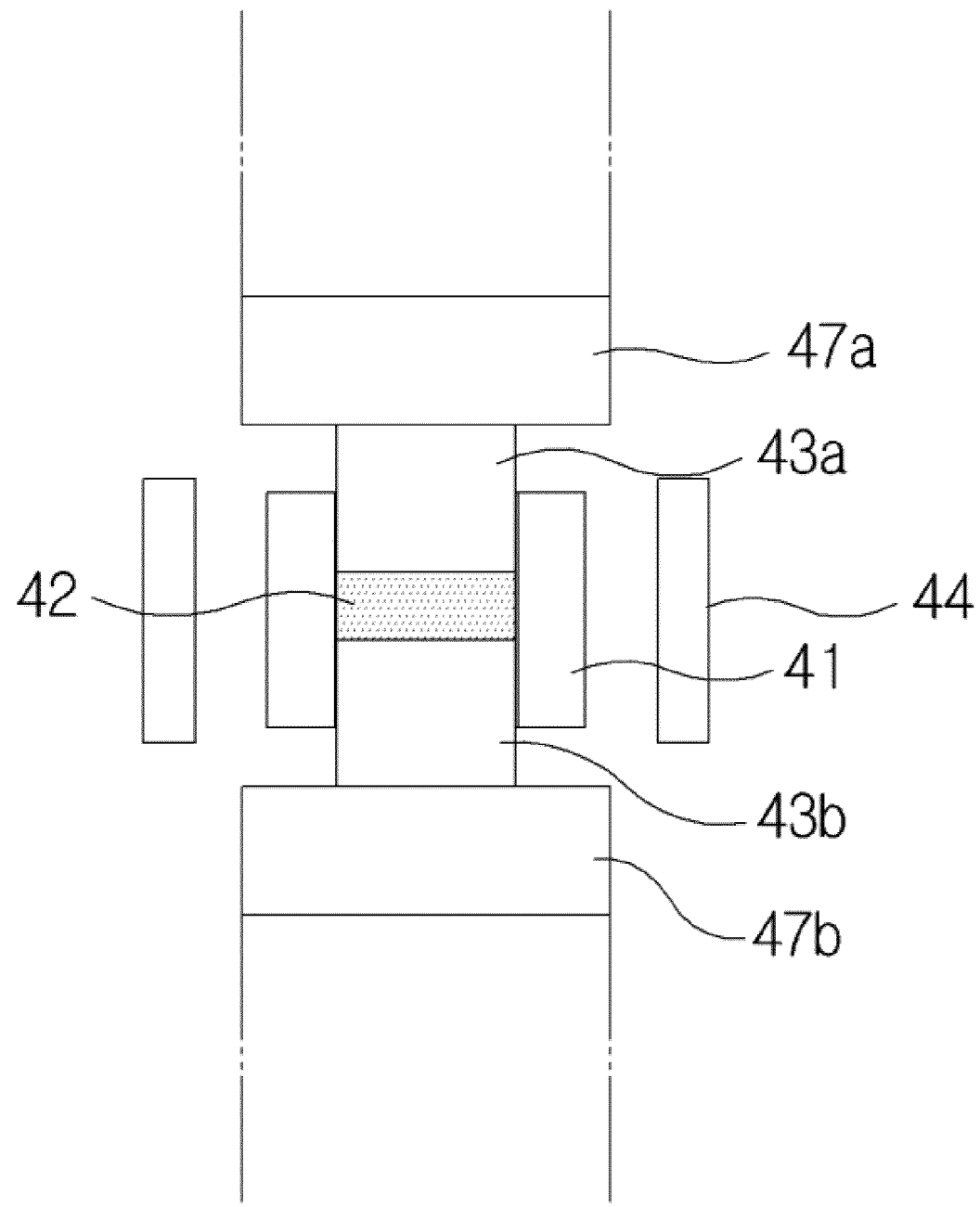
FIG. 4 is a cross-sectional view showing in detail a structure of an inside of a chamber for describing the pressurizing and the Ohmic heating according to the present invention.

As shown in FIG. 4, it is the same as the case of the high frequency induction heating except that an Ohmic heating body 44 is used around the mold 41 instead of the induction coil and therefore, the description thereof will not be repeated. A plate type Ohmic heating body 44 surrounds the circumference of the die type mold 41.

Thirdly, large current flows in the silicon powders.

Figure 5:
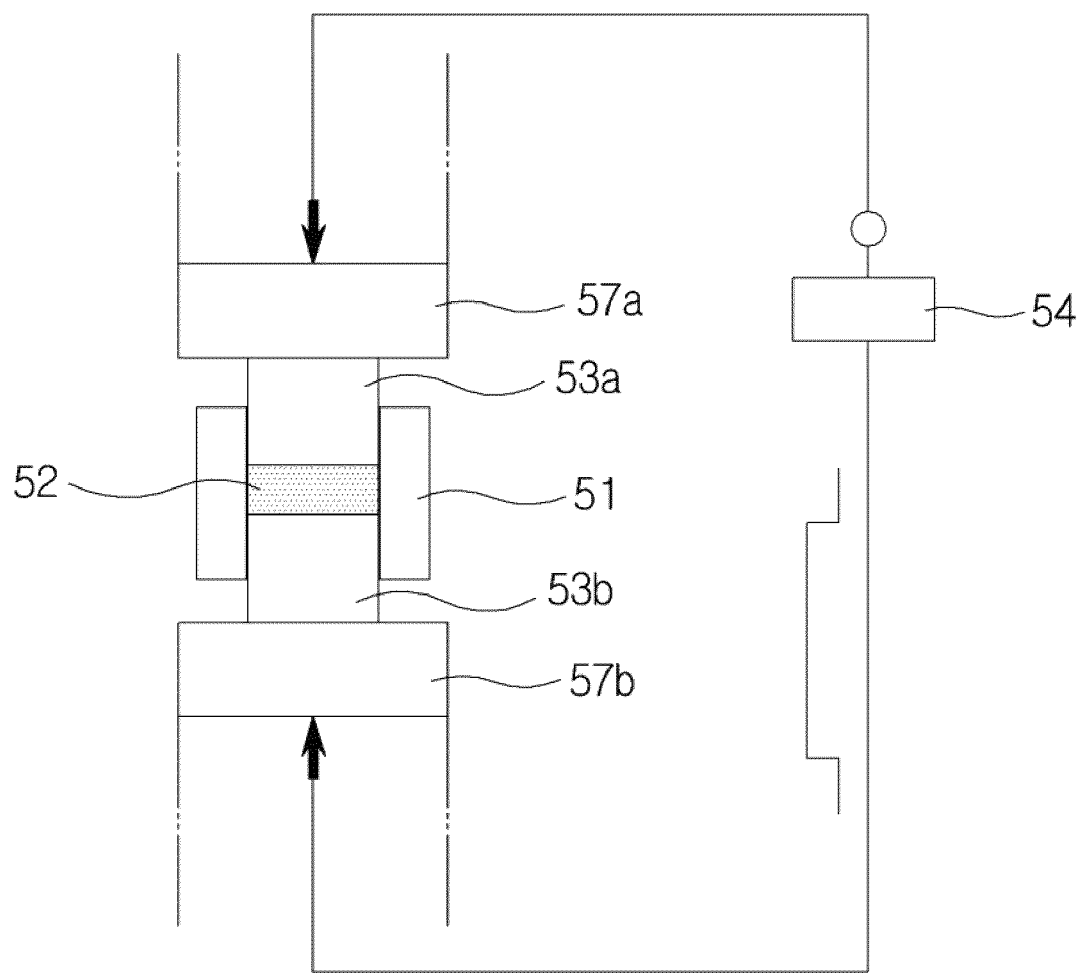
FIG. 5 is a cross-sectional view showing in detail a structure of an inside of a chamber for describing the pressuring and the heating by large current according to the present invention.

As shown in FIG. 5, a difference from 1) the case of using the induction coil or 2) the case using the Ohmic heating body is that a power supply means 54 for applying large current to silicon powders 52 in a mold 51 is provided.

A configuration of a system for the molding will be described. The system for the molding comprises:

1) a die assembly (die, upper and lower punches) configured of the conductive die 51 in which powders are loaded and upper and lower punches 53a and 53b that pressures the silicon powders 52 loaded in the conductive die 51;

2) a large current supply means 54 that surrounds a circumference of the conductive die 51 and applies large current to the silicon powders 52 in the conductive die;

3) an oil pressure means that actuates the upper and lower punches 53a and 53b on a conductive block applying pressure to the silicon powders 52;

4) a vacuum means that maintains a chamber 55 including the silicon powders 52 loaded in the die and the die assembly in a vacuum state; and 5) a controlling means 56 that controls these means.

Preferably, all of the conductive die type mold, the conductive punch, and the conductive block are made of graphite.

A binding between the powders is induced by simultaneously applying electrical energy (direct current+alternating current or pulsed direct current) and pressure to the powders and the molding and the sintering of the powders are simultaneously performed.

TABLE 1

Density ratio and bending strength of poly-Si powder pellets, and electrical resistivity of Si crystals produced with the poly-Si powder pellets, as functions of pallet fabrication condition.

| Sample | Pellet diameter (mm) | Pressing pressure (MPa) | Peak sintering temperature (° C.) | Holding time at peak temperature (sec) | Density ratio (%) | Bending strength (MPa) | Electrical resistivity (Ω cm) |
|---|---|---|---|---|---|---|---|
| No. 1 | 20 | 80 | 800 | 0 | 62.2 | 0.0 | 5.8 |
| No. 2 | 20 | 80 | 1000 | 0 | 66.5 | 11.8 | 4.2 |
| No. 3 | 20 | 80 | 800 | 180 | 63.9 | 8.1 | 8.4 |
| No. 4 | 20 | 80 | 1000 | 180 | 73.0 | 47.5 | 25.0 |
| No. 5 | 20 | 80 | 900 | 60 | 67.1 | 8.1 | 9.3 |
| No. 6 | 40 | 20 | 900 | 180 | 61.7 | 2.1 | 4.0 |

When fabricating the polycrystalline silicon powder compacts using the method according to the present invention as described above, as shown in Table 1, it is preferable to simultaneously increase the molding temperature, the molding time, and the molding pressure in order to simultaneously improve density, strength, and purity.

Figure 6:
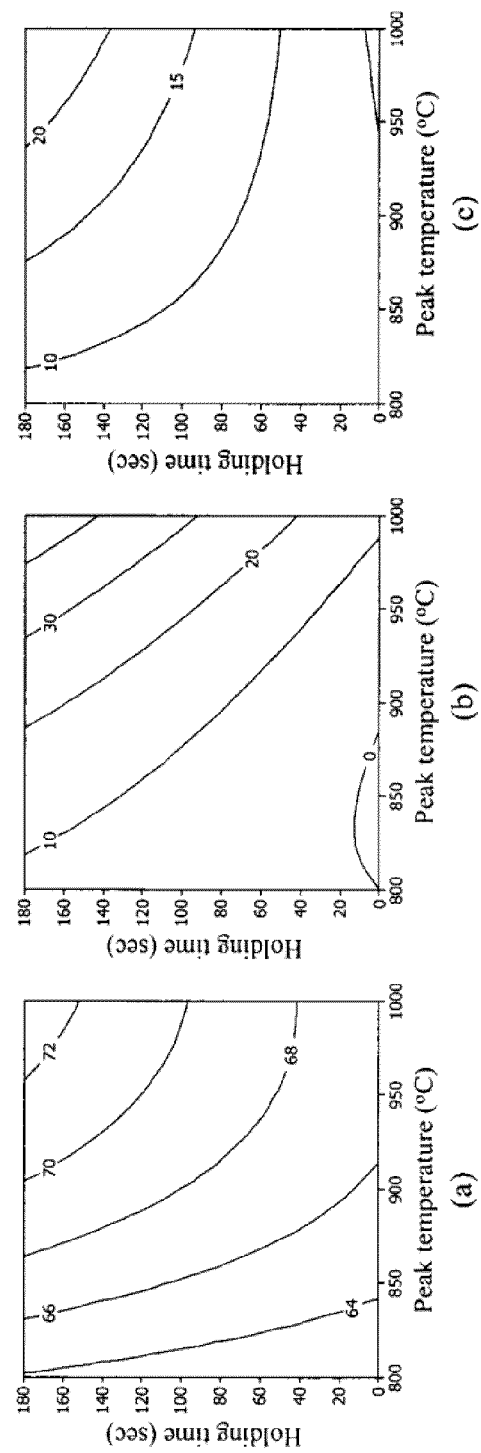
FIG. 6 is contour plots describing the response surface for (a) density ratio and (b) bending strength of silicon powder compacts, and (c) electrical resistivity of silicon ingot, prepared by melting the silicon powder compacts, as a function of parameter pair.

As shown in FIG. 6, this is because the reaction of reducing a $SiO_2$ type oxide existing on the surface of the polycrystalline silicon powder to SiO type oxide having large volatility is effectively triggered at a high temperature, at a high pressure, and in a long holding time to improve an oxide refining effect.

Also, in case of growing the silicon crystal requiring higher purity than one usually required or using the low grade polycrystalline silicon powder as a starting material, it is preferable that all the compacts fabricated by sintering with the above-mentioned methods, after the sintering, are subjected to the air washing to remove the contamination layer on the surface part of the compacts and are melted or stored after a dry process.

Figure 7:
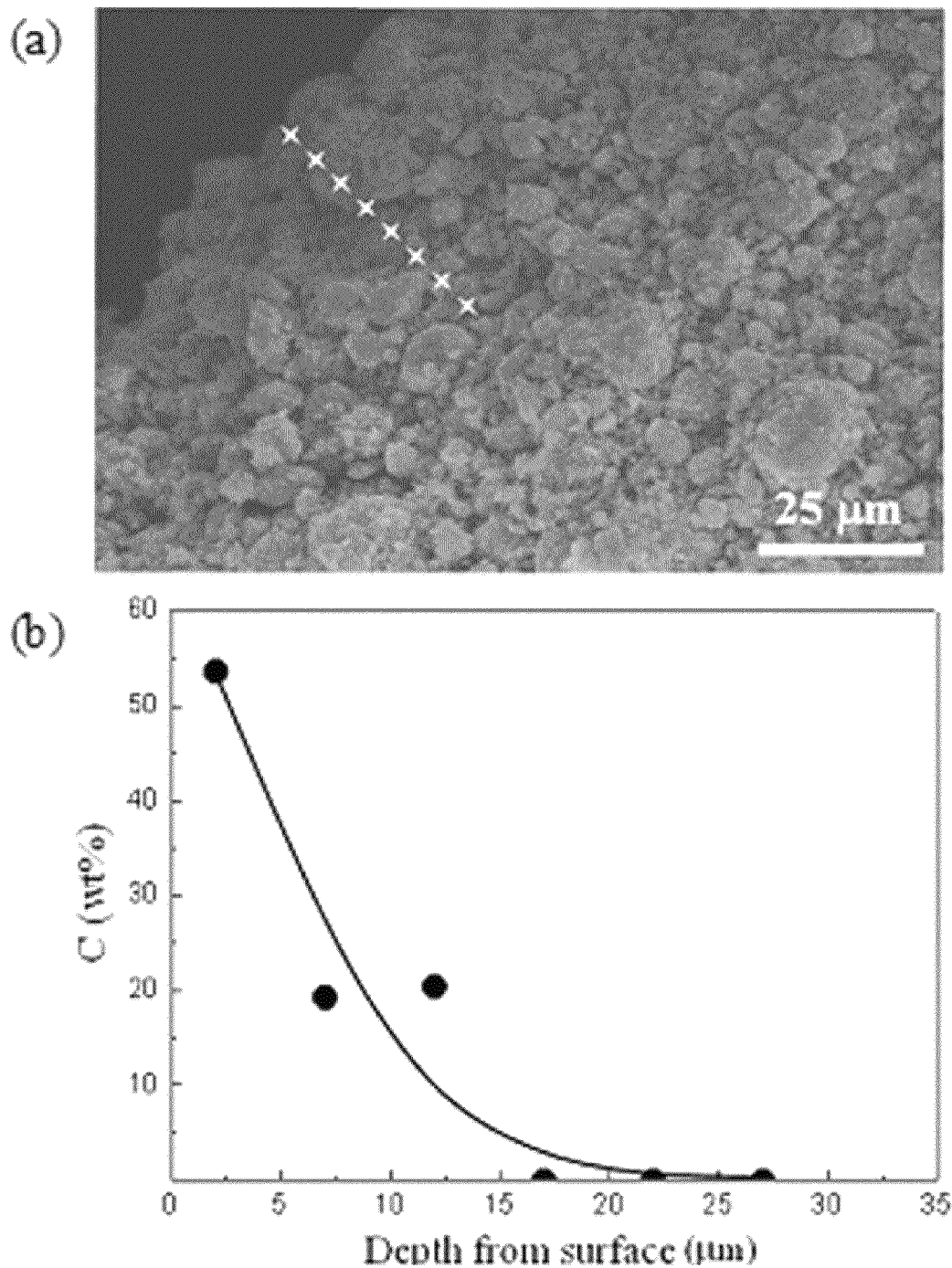
FIG. 7 is (a) SEM fractography and (b) carbon concentration profile along the transverse direction of the disk type silicon powder compact.

As shown in FIG. 7, since the penetration depth of carbon, which is a contamination source inflowed from the graphite die or the punch, is within 10 to 15 μm, this can be removed only by a simple air washing process. Also, this is because the moisture adsorbed during the air washing process can be removed by the dry process.

Although the implementation example disclose the fine powders generated in the process of fabricating the current high purity polycrystalline silicon and the silicon scraps generated in the semiconductor process, the mixture of the fine polycrystalline silicon powders and the silicon scraps may be applied to the present invention.

Those skilled in the art will appreciate that the conceptions and specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A method for fabricating silicon compacts, the method comprising:
   loading silicon powders into a mold in a vacuum atmosphere without adding a binder; and
   simultaneously applying pressure and heat to the silicon powders in the mold at a molding pressure of at least 80 MPa and at a molding temperature of 800° C.-1000° C. to obtain the silicon compacts having a density ratio of at least 60% and an electrical resistivity of at least 4.0 Ω·cm.

2. The method for fabricating silicon compacts according to claim 1, further comprising a pre-treating step of drying the silicon powders in a vacuum atmosphere.

3. The method for fabricating silicon compacts according to claim 1, wherein the silicon powders are polycrystalline silicon powders generated in thermal decomposition processes of silicon containing gases, silicon scraps generated in a semiconductor process, or a mixture of the polycrystalline silicon powders and the silicon scraps.

4. The method for fabricating silicon compacts according to claim 3, wherein the silicon scraps generated in the semiconductor process are scraps generated in a process of fabricating a silicon substrate by slicing a mono/polysilicon ingot.

5. The method for fabricating silicon compacts according to claim 1, wherein the simultaneously applying of the pressure and the heat comprises heating the silicon powders in the mold to be sintered by a high frequency induction heating while applying pressure thereto.

6. The method for fabricating silicon compacts according to claim 1, wherein the pressurizing and heating of the silicon powders comprises heating the silicon powders in the mold to be sintered with an Ohmic heating body while applying pressure thereto.

7. The method for fabricating silicon compacts according to claim 1, wherein the pressurizing and heating of the silicon powders comprises heating the silicon powders in the mold to be sintered by applying electric current to the silicon powders while applying pressure thereto.

8. The method for fabricating silicon compacts according to claim 1, wherein the simultaneously applying of the pressure and the heat is performed at a molding pressure and a molding temperature so as to generate a reaction of reducing oxide existing on a surface of the silicon powders.

9. The method for fabricating silicon compacts according to claim 1, wherein the simultaneously applying of pressure and heat is held at the molding pressure of at least 80 MPa and at the molding temperature of 800° C.-900° C. for a time of at least 180 seconds to obtain the silicon compacts having a bending strength of at least 8 MPa.

10. The method for fabricating silicon compacts according to claim 1, wherein the simultaneously applying of pressure and heat is held at the molding pressure of at least 80 MPa and at the molding temperature of 900° C.-1000° C. for at least 60 seconds to obtain the silicon compacts having the bending strength of at least 8 MPa.

11. The method for fabricating silicon compacts according to claim 1, further comprising removing a contamination layer on a surface part of the silicon compacts by performing an air washing after the simultaneously applying of the pressure and the heat.

12. The method for fabricating silicon compacts according to claim 1, wherein the molding temperature is one selected from the group consisting of 800° C., 900° C., and 1,000° C.

13. The method for fabricating silicon compacts according to claim 12, wherein the molding temperature is 800° C.

14. The method for fabricating silicon compacts according to claim 12, wherein the molding temperature is 900° C.

15. The method for fabricating silicon compacts according to claim 12, wherein the molding temperature is 1,000° C.

* * * * *